US006737578B2

(12) United States Patent
Higuchi

(10) Patent No.: US 6,737,578 B2
(45) Date of Patent: May 18, 2004

(54) ELECTRIC CONNECTION BOX

(75) Inventor: Eiji Higuchi, Yokkaichi (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 0 days.

(21) Appl. No.: 10/615,016

(22) Filed: Jul. 9, 2003

(65) Prior Publication Data

US 2004/0007374 A1 Jan. 15, 2004

(30) Foreign Application Priority Data

Jul. 9, 2002 (JP) ....................................... 2002-200532

(51) Int. Cl.[7] ................................................ H05K 5/00
(52) U.S. Cl. ......................... 174/50; 174/52.1; 174/135; 220/374; 210/266; 285/154.1
(58) Field of Search ............................. 174/50, 48, 49, 174/135, 52.1, 17 VA; 361/758; 220/374, DIG. 6, 371; 210/266; 285/154.1

(56) References Cited

U.S. PATENT DOCUMENTS 4,952,753 A 8/1990 Hayashi et al.
5,159,155 A * 10/1992 Nishihara .................... 174/50
5,421,457 A * 6/1995 Listenberger ............... 206/388
5,661,265 A * 8/1997 Yarbrough et al. ........... 174/50
6,172,300 B1 * 1/2001 Kawaguchi .................. 174/59
6,610,927 B2 * 8/2003 Dinh et al. ................... 174/66

FOREIGN PATENT DOCUMENTS

EP 0 930 686 A1 7/1999

* cited by examiner

*Primary Examiner*—Dhiru R Patel
(74) *Attorney, Agent, or Firm*—Oliff & Berridge, PLC

(57) ABSTRACT

A fuse box is mounted on an upper surface of a battery. A battery fuse accommodated inside the fuse box and a battery post projected from the battery are electrically connected to each other through a battery terminal and bus bars. A plurality of drainage holes are formed on a lower case of the fuse box. A droplet-dividing rib having a certain height projects from a bottom wall of the case of the fuse box at a position between adjacent drainage holes to divide and isolate the gap between the drainage holes to prevent current leaks or shorts between the bus bars due to liquid drained from the drainage holes.

6 Claims, 5 Drawing Sheets

Fig. 3
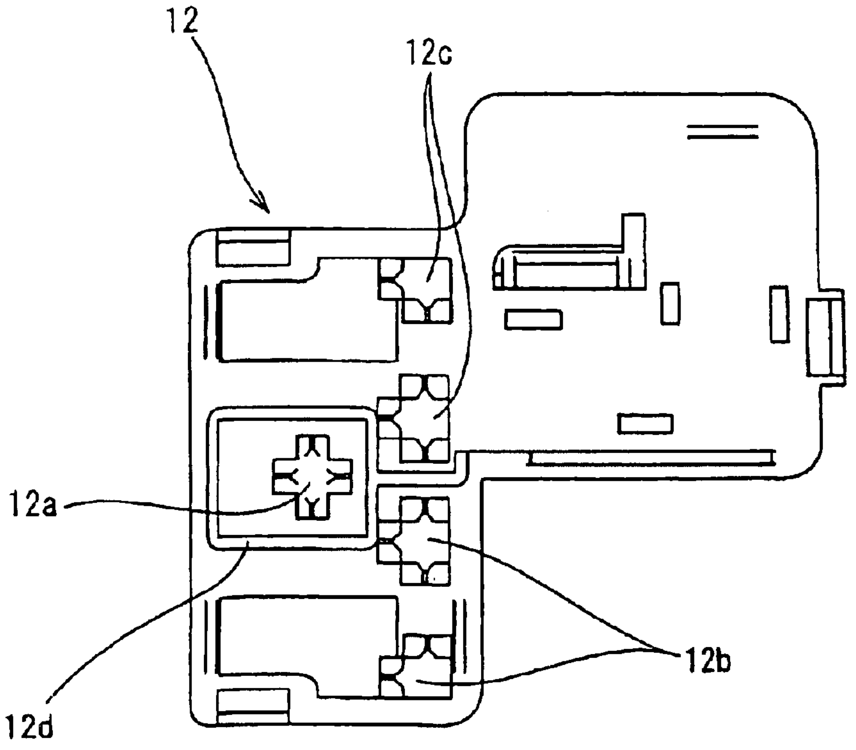
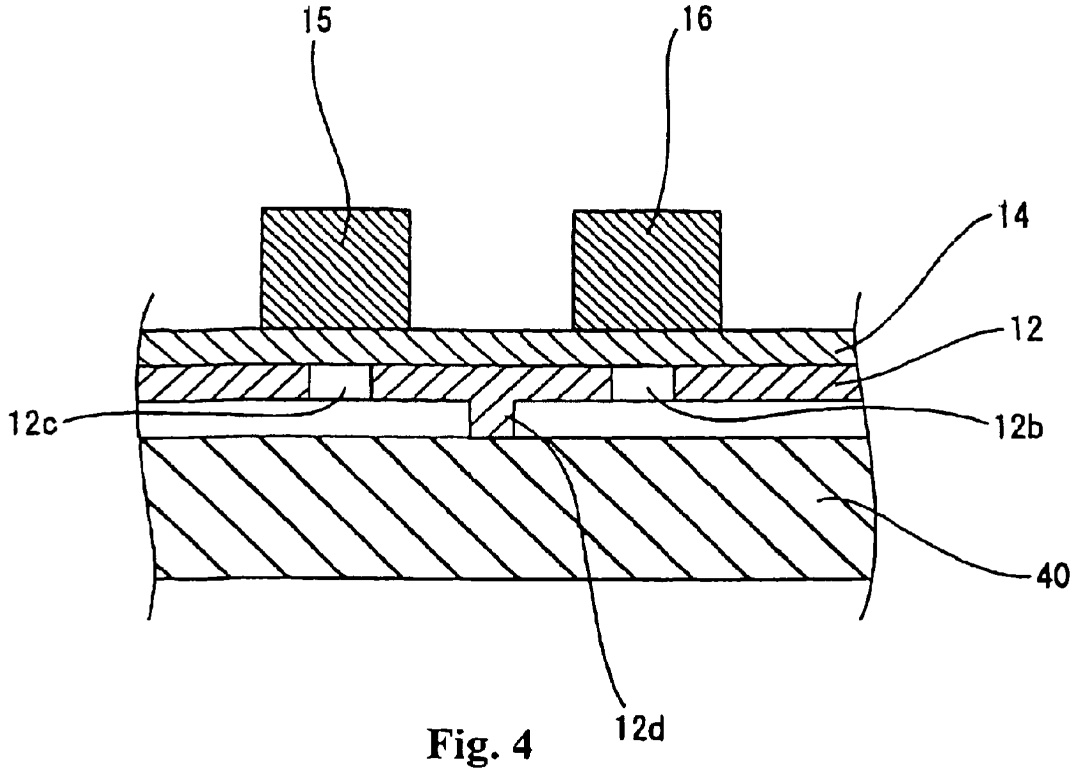
Fig. 4

Fig. 5
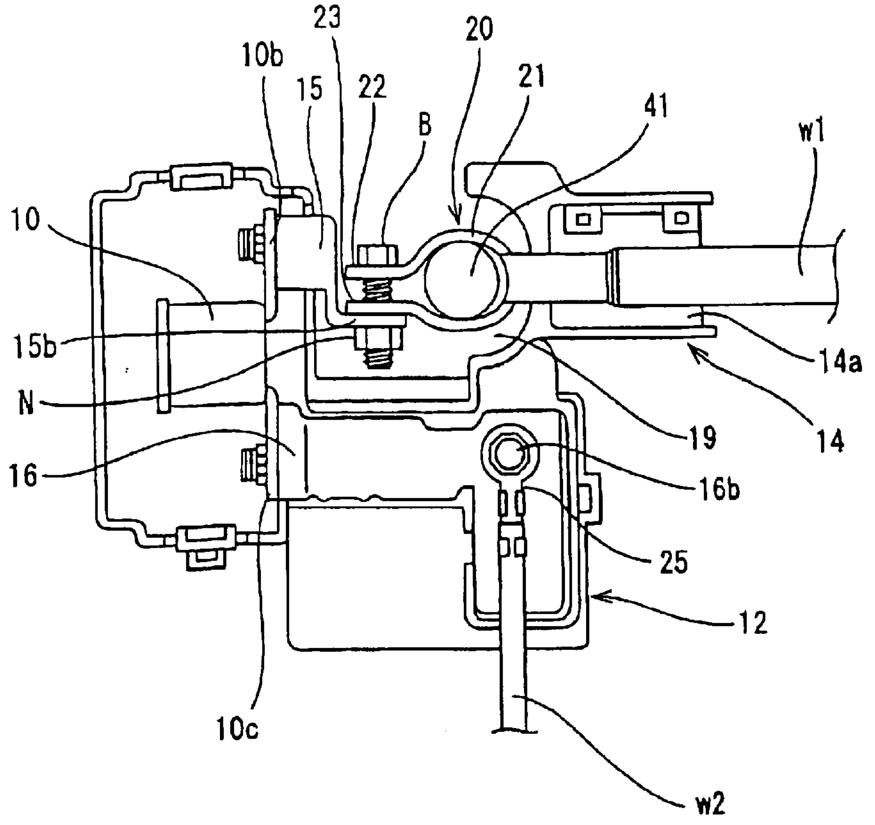
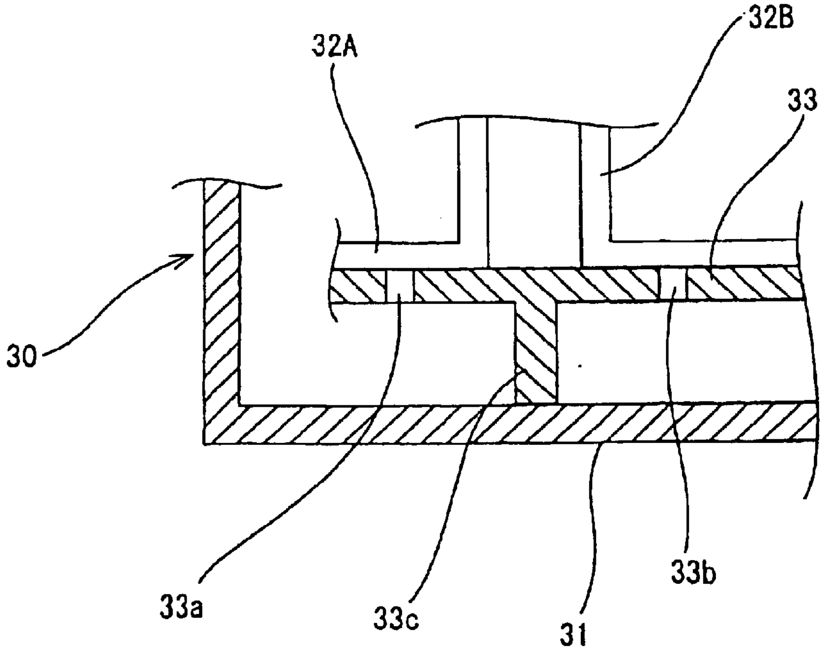
Fig. 6

ELECTRIC CONNECTION BOX

BACKGROUND OF THE INVENTION

1. Field of Invention

The present invention relates to an electric connection box. More particularly, the present invention is intended to prevent penetrated water from causing a short.

2. Description of Related Art

An electric connection box to be disposed in the engine compartment has a drainage hole for discharging liquid which has penetrated therein. Some examples of liquid entering in the electric connection box are water from heavy rain, moisture and when high-pressure cleaning liquid blows into an engine compartment of a vehicle.

For example, as shown in FIG. 7, bus bars 3A, 3B and drainage holes 2*a*, 2*b* are formed on a bottom wall 2 of the case of an electric connection box 1. Frequently, the electric connection box 1 is disposed over a member 4 mounted in an engine compartment.

It is very difficult to bring the lower surface of the bottom wall 2 of the case of the electric connection box 1 into close contact with the upper surface of the member 4 and a gap H is present therebetween. When liquid penetrates into the gap H and collects, the liquid enters the drainage holes 2*a*, 2*b*, which may cause a current leak or electrical short to occur between the bus bars 3A and 3B.

To prevent generation of the current leak or short, one could increase the space the bottom wall 2 of the case at the gap H from the upper surface of the member 4. As a result, it is difficult for the liquid that has penetrated into the gap H to collect and does not enter the drainage holes 2*a*, 2*b* disposed upward from the upper surface of the member 4. Thus, it is possible to prevent the generation of the current leak or short.

However, if the electric connection box 1 is spaced at a comparatively long distance from the upper surface of the member 4 to make the gap H large, the entire height of the electric connection box is very large.

This problem occurs not only where the electric connection box 1 is mounted on the member 4, but also where an electric connection box having a lower cover mounted thereon is disposed in the engine compartment.

That is, where bus bars are disposed on the bottom wall of the case of the electric connection box and the bottom wall has drainage holes formed thereon. The lower cover is mounted on the case of the electric connection box, and a short or current leakis liable to occur between the bus bars because of liquid that has been penetrated into the lower cover and collected therein, if the gap between the bottom wall of the lower cover and the bottom wall of the case of the electric connection box is small. Again, to avoid this, it is conceivable to space the bottom wall of the lower cover at a comparatively larger interval from the bottom wall of the case of the electric connection box. However, this makes the electric connection box large.

SUMMARY OF THE INVENTION

The present invention has been made in view of the above-described problem. Accordingly, it is an object of the present invention to prevent a current leak or electrical short from occurring between bus bars because of liquid that has penetrated into an electric connection box without widening the gap between the bottom wall of the electric connection box and the member over which the electric connection box is mounted and without making the lower cover-provided electric connection box large.

To achieve the object, according to the present invention, there is provided an electric connection box, disposed in an engine compartment of a vehicle, having a plurality of drainage holes formed on a bottom wall of a case thereof and bus bars mounted on the bottom wall of the case.

A droplet-dividing rib is projected from the bottom wall of the case at a position between the drainage holes adjacent to each other. The droplet-dividing rib is in contact with a surface of a member disposed below the bottom wall of the case, and a space is provided between the bottom wall of the case and the member.

Because the droplet-dividing rib is formed between the drainage holes it divides any water or other liquid that has collected between the bottom wall of the case and the member disposed below the bottom wall of the case. In this way, it is possible to prevent the bus bars inside the electric connection box from being electrically conductive to each other through the water and hence prevent generation of a short.

This construction is preferably used when the electric connection box is a fuse box that is mounted on an upper surface of a battery.

The member disposed below the bottom wall of the case is a battery. A bottom wall of a case of the fuse box is mounted on an upper surface of the battery, with a slight gap provided between the upper surface of the battery and the bottom wall of the case of the fuse box. A lower end of the droplet-dividing rib projected from the bottom wall of the case contacts the upper surface of the battery.

Because the droplet-dividing rib divides water that has collected in a slight gap between the bottom wall of the case of the fuse box and the battery disposed below the bottom wall of the case, the bus bars disposed on the bottom wall of the case of the fuse box do not become electrically conductive to each other through the water. Hence, it is possible to prevent the occurrence of a short or current leak.

Since the fuse box 11 is directly installed on the battery, it is unnecessary to provide the space for the fuse box as in the conventional fuse box. Thus, a limited space in a vehicle can be effectively utilized.

This construction is applicable not only to the gap between the fuse box and the battery, but also to the case where a lower cover is mounted on the electric connection box.

More specifically, in mounting a lower cover on a lower portion of the case of the electric connection box, the droplet-dividing rib is projected from the bottom wall of the case and contacts an inner surface of a bottom wall of the lower cover.

With this, the droplet-dividing rib is provided inside the electric connection box and prevents a short from occurring between the bus bars.

BRIEF DESCRIPTION OF THE DRAWINGS

The foregoing and other features of the present invention will become apparent with reference to the accompanying drawings, wherein:

FIG. 3 is a rear view showing a lower case.

FIG. 4 is a schematic view showing a state in which the fuse box is mounted on the battery box.

FIG. 5 is a plan view showing the fuse box.

FIG. 6 is a sectional view showing a fuse box according to a second embodiment of the present invention.

DETAILED DESCRIPTION OF PREFERRED EMBODIMENTS

Figure 1:
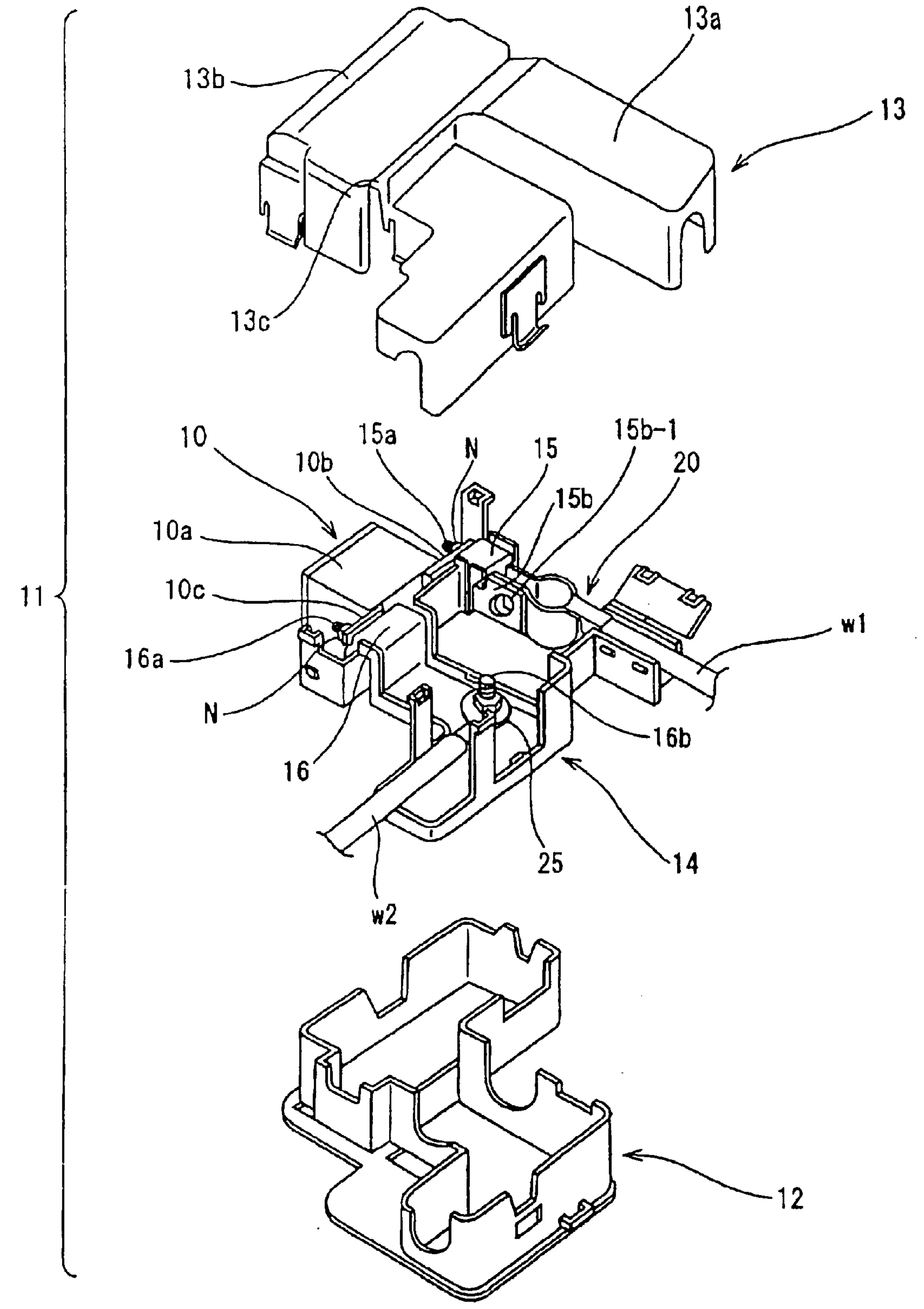
FIG. 1 is an exploded perspective view showing a fuse box according to a first embodiment of the present invention.
Figure 2:
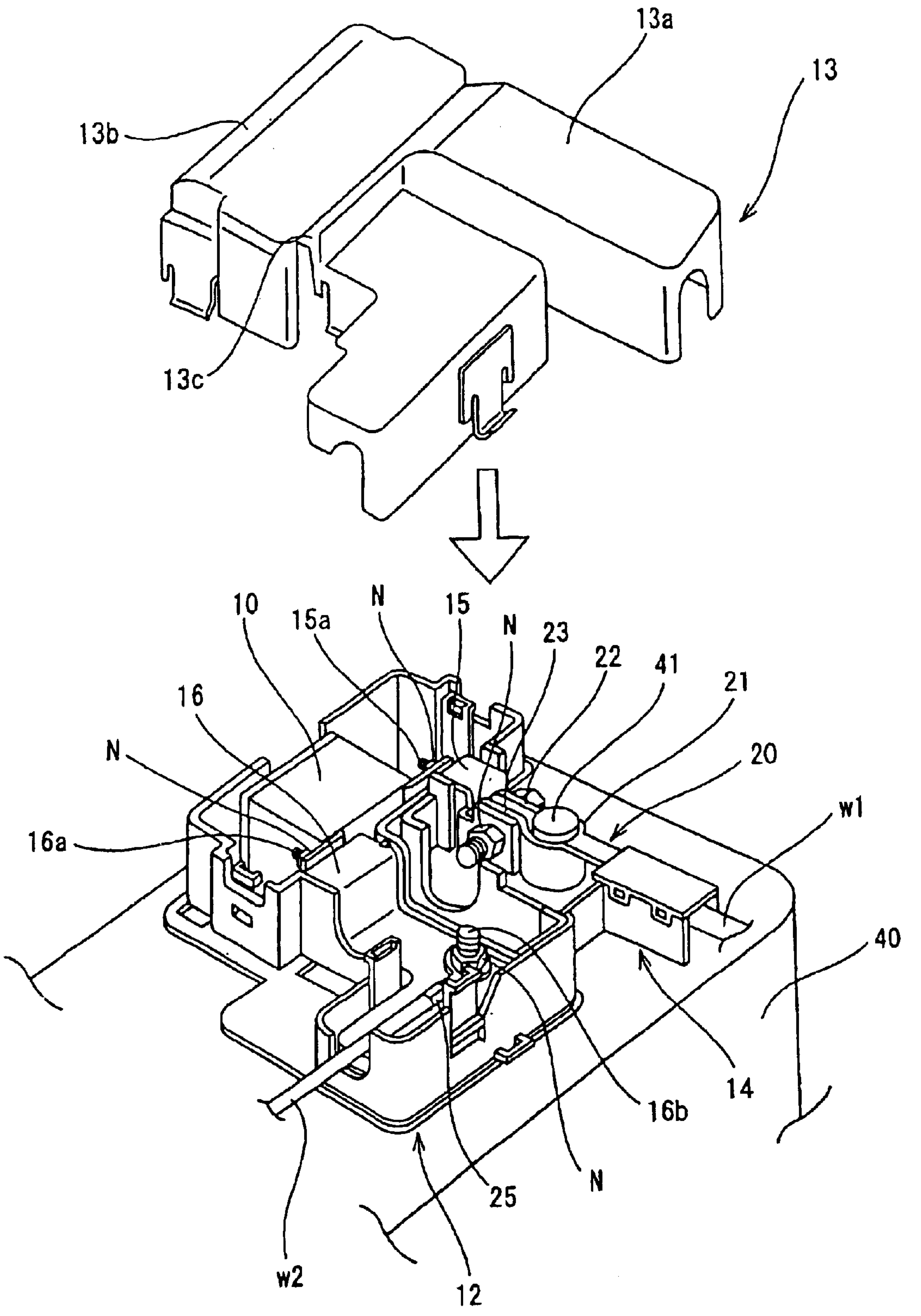
FIG. 2 is a perspective view showing a state in which the fuse box is fixed to a battery box.
Figure 7:
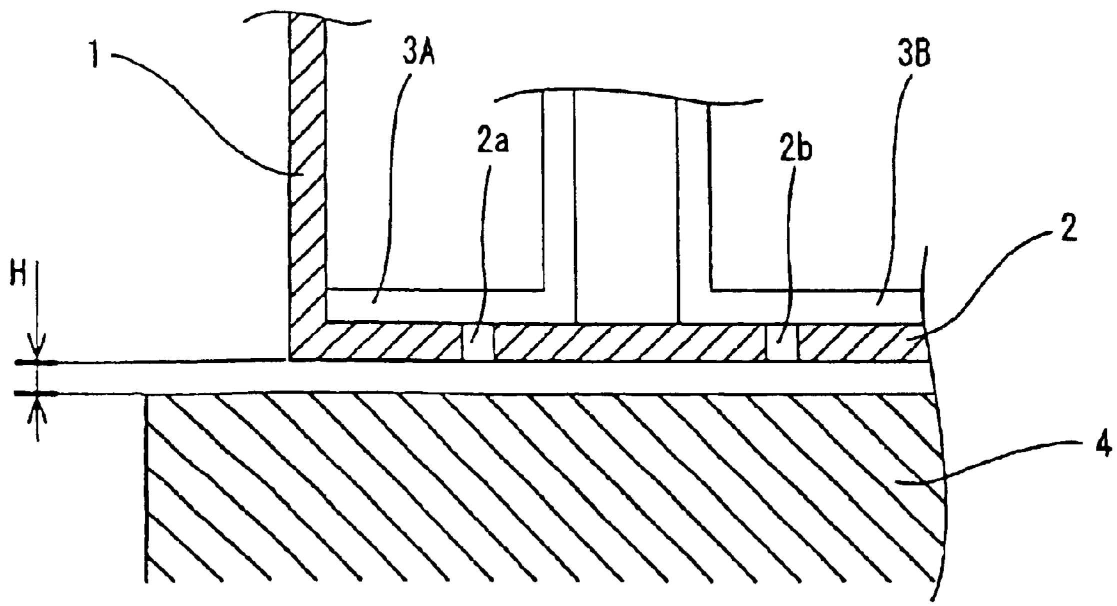
Fig. 7 RELATED ART
FIG. 7 shows an embodiment of conventional art.

The embodiments of the present invention will be described below with reference to the drawings. FIGS. 1 through 5 show a first embodiment of the present invention in which fuse box 11 is disposed on a battery box 40 mounted in an engine compartment.

A case composed of the fuse box 11 includes a lower case 12, an upper case 13, and an intermediate case 14. The intermediate case 14 fixedly accommodates a battery fuse 10, an input-side bus bar 15 connected to a terminal of the battery fuse 10, and an output-side bus bar 16 also connected to the terminal of the battery fuse 10. A battery terminal 20 may be fixedly fitted on a battery post 41 projecting from an upper surface of the battery box 40. The battery terminal 20 is fastened to the input-side bus bar 15 to electrically connect the battery fuse 10 to a battery.

More specifically, one end of the input-side bus bar 15 overlaps an input terminal 10*b* and projects horizontally from one side of a bottom surface of a body 10*a* of the battery fuse 10, while one end of the output-side bus bar 16 overlaps an output terminal 10*c* and projects horizontally from the other side of the bottom surface of the body 10*a* of the battery fuse 10. Screw portions 15*a* and 16*a* project from the input-side bus bar 15 and the output-side bus bar 16 respectively and penetrate through a through-hole (not shown) of the input terminals 10*b* and a through-hole (not shown) of the output terminal 10*c*, respectively, and then are fixed with a nut N.

After the input-side bus bar and the output-side bus bar are accommodated in the case body, it is possible to fasten the input-side bus bar to the input terminal of the battery fuse and the output-side bus bar to the output terminal of the battery fuse with bolts.

The intermediate case 14 in which the battery fuse 10, input-side bus bar 15, and the output-side bus bar 16 are fixedly accommodated is mounted on the lower case 12, and the upper case 13 is mounted on the lower case 12.

Since the intermediate case 14 directly contacts the input-side bus bar 15 and the output-side bus bar 16 and both respectively have a high calorific value, the intermediate case 14 is made of a heat-resistant resin. To minimize its use, the resin is used for only the portion of the intermediate case 14 that contacts the input-side bus bar 15 and the output-side bus bar 16. Each of the lower case 12 and the upper case 13 are made of an inexpensive synthetic resin. Considering that the intermediate case 14 is directly placed on the upper surface of the battery box 40, it is also preferable that a chemical-resistant material is used for the intermediate case 14.

As shown in FIG. 3, the lower case 12 is disposed at a bottom wall of the fuse box 11, and a drainage port 12*a* is formed at the position where the battery fuse 10 is disposed. A drainage port 12*b* is formed at the position where the input-side bus bar 15 is disposed and a drainage port 12*c* is formed at the position where the output-side bus bar 16 is disposed. A droplet-dividing rib 12*d* having a predetermined height is projectingly formed between drainage ports 12*a* and 12*b*, between drainage ports 12*b* and 12*c*, and between drainage ports 12*c* and 12*a*.

In the upper case 13, one half serves as an opening/closing cover 13*a*. A hinge 13*c* is interposed between the opening/closing cover 13*a* and another half 13*b* locks to the lower case 12 to open and close the opening/closing cover 13*a*.

The battery terminal 20 has a projected circular-arc portion 21 which is crimped to the tip of an electric wire w1 of a power circuit and fits on the periphery of the battery post 41. A fastening piece 22 projects from the tip of the circular-arc portion 21 at its one side, and a fastening piece 23 making a pair with the fastening piece 22 projects from the tip of the circular-arc portion 21 at its other side. A bolt opening (not shown) is formed on each of the fastening pieces 22 and 23.

As shown in FIG. 5, the electric wire w1 is accommodated in an electric wire accommodation portion 14*a* of the intermediate case 14. An opening 19 is formed on the supporting plate 14 and the lower case 12 at a position thereof corresponding to the position of the circular-arc portion 21, of the battery terminal 20, that is exposed to the outside.

The other end portion of the input-side bus bar 15 is extended to a position where the other end portion overlaps the side of the fastening piece 23 to form a connection piece 15*b*, through which a bolt opening 15*b*-1 communicates with the bolt opening (not shown) of the fastening pieces 22 and 23.

A screw portion 16*b* projects upward from the upper surface of the output-side bus bar 16 at an intermediate position of the other side thereof. Thereby a terminal 25 has disposed at an end an electric wire w2 to be connected to a relay box (not shown) is fastened with the nut N.

The method of fixing the fuse box 11 to the battery box 40 is described below.

Initially, the circular arc portion 21 of the battery terminal 20 is fitted on the periphery of the battery post 41 projecting upward from the battery box 40. With the bolt opening (not shown) of each of the fastening pieces 22, 23 and the bolt opening 15*b*-1 of the connection piece 15*b* of the input-side bus bar 15 overlapping each other, the bolt B is inserted through the bolt openings and clamped with the nut N. Thereby, the circular arc portion 21 fits on the periphery of the battery post 41. In this operation, the battery and the battery fuse 10 are electrically connected to each other, and the fuse box 11 is fixed to the battery box 40. Then the opening/closing lid 13*a* of the upper case 13 is closed to lock the upper case 13 to the lower case 12.

At this time, as shown in FIG. 4, the droplet-dividing rib 12*d* projects from the rear side of the lower case 12 and contacts the battery box 40.

With this, the droplet-dividing rib 12*d* projects from the rear side of the lower case 12, contacts the wall surface of the battery box 40 and cuts off the gap between the drainage ports 12*a* and 12*b*, 12*b* and 12*c*, and 12*c* and 12*a*. Thus, even when water or other liquid collects between the lower case 12 and the battery box 40, it is possible to prevent penetrated liquid from causing a short or current leak to occur between the input-side bus bar 15 and the output-side bus bar 16 without widening the gap between the lower case 12 and the battery box 40.

Since the fuse box 11 is directly installed on the battery box 40, it is unnecessary to provide a space for the fuse box as in the conventional fuse box. Thus, a limited space in a vehicle can be effectively utilized.

Since the fuse 10 is accommodated lengthwise inside the fuse box, it is possible to make the height of the fuse box small. Thus, this construction allows a clearance between the fuse box 11 and a bonnet (not shown) to be securely obtained.

FIG. 6 shows a second embodiment of the present invention. An electric connection box 30 has a lower cover 31 and an upper cover (not shown). A case 33 on which bus bars 32A and 32B are placed is mounted on the lower cover 31. A plurality of drainage holes 33*a*, 33*b* are formed on a bottom wall of the case 33. A droplet-dividing rib 33*c* projects between the drainage holes 33*a* and 33*b* and contacts an inner surface of a bottom wall of the lower cover 31.

With this, the droplet-dividing rib 33*c* divides liquid which has collected in the lower cover 31 through the drainage holes 33*a*, 33*b*. Thus, even when the liquid collects in the lower cover 31, it is possible to prevent penetrated liquid from causing a short or current leak to occur between bus bars 32A and 32B without widening the gap between the case 33 and the lower cover 31.

As apparent from the foregoing description, according to the present invention, the droplet-dividing rib projected from the rear side of the electric connection box contacts the wall of the member disposed below the electric connection box, thus cutting off the gap between the adjacent drainage holes. Thus, even when liquid collects in the gap between the bottom wall of the electric connection box and the member over which the electric connection box is mounted, it is possible to prevent a short or current leak between bus bars without widening the gap between the bottom wall of the electric connection box and the member over which the electric connection box is mounted.

Since the fuse box is directly installed on the battery, it is possible to accomplish space-saving design.

This construction is applicable not only to the case where the electric connection box is mounted on a member, but also to the case where the lower cover is mounted on a lower portion of the electric connection box. In the latter case, the droplet-dividing rib projected from the bottom wall of the case contacts the inner surface of the bottom wall of the lower cover, thus preventing a short or current leak

What is claimed is:

1. An electric connection box, disposed in an engine compartment of a vehicle, comprising:

a case having a bottom wall with an interior and exterior surface, the bottom wall having a plurality of drainage holes communicating between the interior and exterior surface and bus bars mounted on the interior surface; the case further having a droplet-dividing rib that projects from the exterior surface of the bottom wall and positioned between the plurality of drainage holes adjacent one another, and the droplet-dividing rib being formed so as to contact with a surface of a member disposed below the bottom wall and form spaces between the exterior surface of the bottom wall and a top surface of the member that are divided to prevent liquid from one space from coming into contact with another space.

2. The electric connection box according to claim 1, wherein the case is a fuse box and the member is a battery.

3. The electric connection box according to claim 1, wherein the member includes a lower cover bottom wall so as to form a lower cover inner surface, whereby the lower cover is mounted below the casing bottom wall so that the droplet-dividing rib contacts the lower cover inner surface.

4. The electric connection box according to claim 1, wherein the casing is made up of an upper case, an intermediate and a lower case.

5. The electric connection box according to claim 4, wherein the intermediate layer is made of heat resistant resin.

6. The electric connection box according to claim 1, wherein a first bus bar of said bars is associated with a first drainage hole of said plurality of drainage holes and a second bus bar of said bars is associated with a second drainage hole of said plurality of drainage holes and the droplet-dividing rib forms divided spaces that prevent liquid from the first drainage hole from coming into contact with the second bus bar so as to prevent current leaks or electrical shorts.

* * * * *